United States Patent
Ferrante et al.

(10) Patent No.: US 7,543,198 B2
(45) Date of Patent: Jun. 2, 2009

(54) TEST DATA REPORTING AND ANALYZING USING DATA ARRAY AND RELATED DATA ANALYSIS

(75) Inventors: William J. Ferrante, Hyde Park, NY (US); John J. Cassels, Marlboro, NY (US); Stephen Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 11/163,527

(22) Filed: Oct. 21, 2005

(65) Prior Publication Data

US 2007/0113134 A1 May 17, 2007

(51) Int. Cl.
G06F 11/00 (2006.01)
G11C 29/00 (2006.01)
G01R 31/28 (2006.01)
G01R 31/02 (2006.01)
G01R 31/26 (2006.01)

(52) U.S. Cl. .................. 714/719; 714/723; 714/733; 714/57; 714/31; 714/25; 714/718; 714/48; 714/46; 324/765; 324/528; 324/759; 324/763; 324/764

(58) Field of Classification Search ............ 714/57, 714/31, 25, 48, 46, 718, 723, 733, 719; 324/527, 324/528, 759, 763–765
See application file for complete search history.

(56) References Cited

U.S. PATENT DOCUMENTS 5,841,785 A * 11/1998 Suzuki ................ 714/718
6,442,733 B1   8/2002 Fujiwara et al.
6,449,741 B1   9/2002 Organ et al.
6,539,505 B1   3/2003 Dahn
6,553,329 B2 * 4/2003 Balachandran .......... 702/118
6,560,731 B2   5/2003 Daehn et al.
6,845,478 B2 * 1/2005 Luong ................... 714/738
7,159,145 B2 * 1/2007 Wang et al. ............... 714/6
2005/0022065 A1 1/2005 Dixon et al.
2005/0039073 A1 2/2005 Hartmann

FOREIGN PATENT DOCUMENTS

CN        1342318        3/2002

* cited by examiner

*Primary Examiner*—Cynthia Britt
*Assistant Examiner*—John J Tabone, Jr.
(74) *Attorney, Agent, or Firm*—Joseph Petrokaitis; Hoffman Warnick LLC (57) ABSTRACT

Reporting and/or analyzing test data from a plurality of tests of an array structure using a data array. One method includes obtaining the test data, and reporting the test data in a data array, which includes at least two portions representing different tests. Data stored in the data array is organized according to a translation table, which describes the locations of data for tests and criteria for data to be analyzed within the data array. Numerous other data arrangements such as a coordinate file listing a pre-defined maximum number of fail points, or a chip report including fail points by chip may also be generated. The data array reports all test data in a more easily generated and stored form, and may be converted to an image. A data analysis method for analyzing data using the data array is also presented.

9 Claims, 8 Drawing Sheets

| Test Name | Set | NumberOfTestsWithinSet | RelativeNumberWithinSet | StartingRow | EndingRow | StartingCol | EndingCol | CoordinateFileMax |
|---|---|---|---|---|---|---|---|---|
| MAP_FSCAN | 1 | 1 | 0 | 0 | 224 | 0 | 0 | 20 |
| MAP_SSCAN1 | 2 | 1 | 0 | 0 | 895 | 256 | 256 | 20 |
| PLD1A | 3 | 1 | 0 | 0 | 895 | 257 | 257 | 20 |
| PLD1B | 4 | 1 | 0 | 0 | 895 | 258 | 258 | 20 |
| SM1_WLNS1 | 5 | 4 | 0 | 0 | 447 | 259 | 370 | 20 |
| SM1_WLNS2 | 5 | 4 | 1 | 0 | 447 | 259 | 370 | 20 |
| SM1_WLNS3 | 5 | 4 | 2 | 0 | 447 | 259 | 370 | 20 |
| ... | ... | ... | ... | ... | ... | ... | ... | ... |
| SM3_WLNS1 | 10 | 4 | 0 | 0 | 447 | 515 | 626 | 20 |
| SM3_WLNS2 | 10 | 4 | 1 | 0 | 447 | 515 | 626 | 20 |
| SM3_WLNS3 | 10 | 4 | 2 | 0 | 447 | 515 | 626 | 20 |
| OV2 | 10 | 4 | 3 | 0 | 447 | 515 | 626 | 20 |
| SM4_WLNS1 | 11 | 4 | 0 | 448 | 895 | 515 | 626 | 20 |
| SM4_WLNS2 | 11 | 4 | 1 | 448 | 895 | 515 | 626 | 20 |
| SM4_WLNS3 | 11 | 4 | 2 | 448 | 895 | 515 | 626 | 20 |
| OV3 | 11 | 4 | 3 | 0 | 895 | 515 | 626 | 20 |
| MAP_SSCAN3 | 12 | 1 | 0 | 0 | 895 | 768 | 768 | 20 |
| PLD3A | 13 | 1 | 0 | 0 | 895 | 769 | 769 | 20 |
| PLD3B | 14 | 1 | 0 | 0 | 895 | 770 | 770 | 20 |

FIG. 5

05090LDR001.000 90150NG7WAF5 site_x=11 site_y=3 pnp=740S PLD3B
  Cartesian coordinates - origin upper left = [770,1021], translated coodinates = [143,1]
05090LDR001.000 90150NG7WAF5 site_x=11 site_y=3 pnp=740S PLD3B
  Cartesian coordinates - origin upper left = [770,1017], translated coodinates = [142,1]
05090LDR001.000 90150NG7WAF5 site_x=11 site_y=3 pnp=740S PLD3B
  Cartesian coordinates - origin upper left = [770,1013], translated coodinates = [141,1]
05090LDR001.000 90150NG7WAF5 site_x=11 site_y=3 pnp=740S PLD3B
  Cartesian coordinates - origin upper left = [770,1009], translated coodinates = [140,1]
05090LDR001.000 90150NG7WAF5 site_x=11 site_y=3 pnp=740S PLD3B
  Cartesian coordinates - origin upper left = [770,1005], translated coodinates = [139,1]
05090LDR001.000 90150NG7WAF5 site_x=11 site_y=3 pnp=740S PLD3B
  Cartesian coordinates - origin upper left = [770,1001], translated coodinates = [138,1]

FIG. 6

| DieX | DieY | TestName | FailCount |
|---|---|---|---|
| 6 | 11 | MAP_FSCAN | 0 |
| 6 | 11 | MAP_SSCAN1 | 0 |
| 6 | 11 | PLD1A | 0 |
| 6 | 11 | PLD1B | 50 |
| 6 | 11 | SM1_WLNS1 | 0 |
| 6 | 11 | SM1_WLNS2 | 200 |
| 6 | 11 | SM1_WLNS3 | 0 |
| ... | ... | ... | ... |
| 6 | 11 | SM3_WLNS1 | 0 |
| 6 | 11 | SM3_WLNS2 | 10 |
| 6 | 11 | SM3_WLNS3 | 0 |
| 6 | 11 | OV2 | 0 |
| 6 | 11 | SM4_WLNS1 | 0 |
| 6 | 11 | SM4_WLNS2 | 0 |
| 6 | 11 | SM4_WLNS3 | 0 |
| 6 | 11 | OV3 | 0 |
| 6 | 11 | MAP_SSCAN3 | 0 |
| 6 | 11 | PLD3A | 0 |
| 6 | 11 | PLD3B | 224 |

FIG. 7

TEST DATA REPORTING AND ANALYZING USING DATA ARRAY AND RELATED DATA ANALYSIS

BACKGROUND OF THE INVENTION

1. Technical Field

The invention relates generally to testing of array structures such as a memory array, and more particularly, to reporting and/or analyzing test data from a plurality of tests of an array structure using a data array.

2. Background Art

In the semiconductor manufacturing industry, devices are tested prior to use. In many cases, the parts being tested have an array structure. For example, one part of a device that is tested is a memory array. Memory testers run a number of tests for each cell (or bit) of the memory array and record failures. Since memory arrays can include a very large number of cells (e.g., 2,097,152 cells for a 1024×2048 array), the amount of data collected can be immense. One approach to collect and organize the data is to log every cell failure to an American Standard Code for Information Interchange (ASCII) file, e.g., an ASCII comma delimited text file or comma separated value (csv) file. The data collected contains details of each failure such as failure locations, test type, failure type, etc. The large amount of data collected using this approach typically requires periodically pausing test execution and queries of the tester hardware during generation of the ASCII file. That is, memory test data is collected all at once. The result is a very large ASCII file which can take an excessive amount of time to generate.

Figure 1:
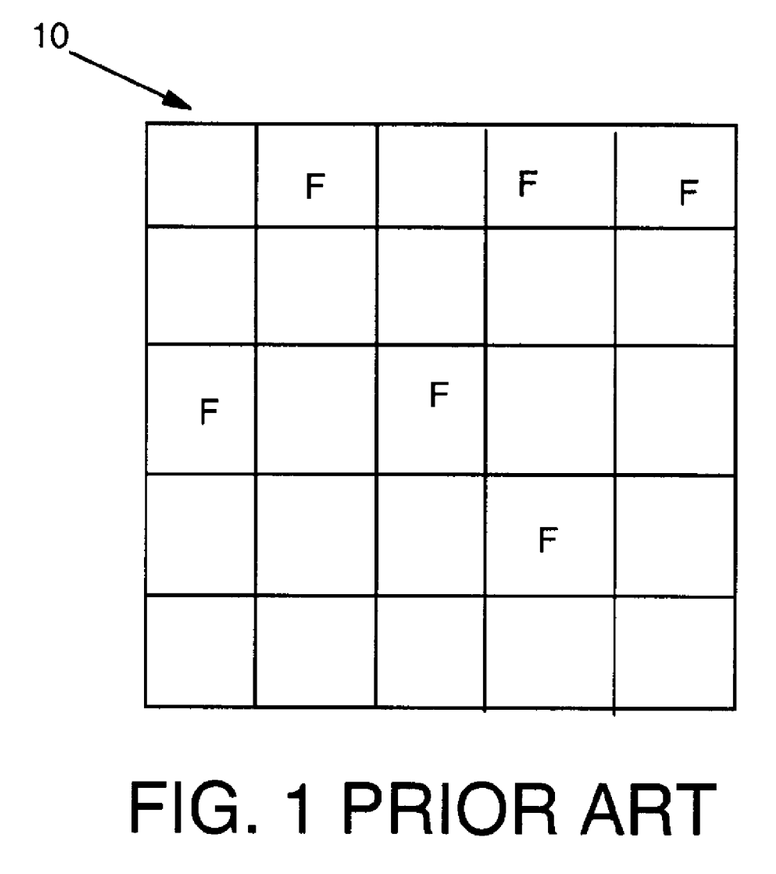
FIG. 1 shows a prior art bit fail map.

One approach to address this situation is to limit the number of failures identified to a predefined maximum. Unfortunately, this approach mandates not capturing all of the failure data. In addition, this approach may add complexity in those cases where the number of failures reaches the predefined maximum. Another approach includes performing a binary dump of the data to a bit fail map, i.e., a physically viewable rendition (image) of the memory array including fail points. FIG. 1 illustrates a simplified bit fail map 10 that is a topographical representation of a 5×5 memory array including failing points (cells) F. Each bit fail map represents a different test applied across the memory array. Hence, each test requires another bit fail map. This approach is advantageous because it can be completed in a relatively short period of time compared to the logging of failures. Although all cell failure points are captured using this approach, other details such as the test type, failure type, etc., are not available.

The formats of the memory test data described above also negatively impacts data analysis.

In view of the foregoing, there is a need in the art for an improved solution to report and/or analyze test data from testing of an array structure.

SUMMARY OF THE INVENTION

Reporting and/or analyzing test data from a plurality of tests of an array structure using a data array is disclosed. One method includes obtaining the test data, and reporting the test data in a data array, which includes at least two portions representing different tests. Data stored in the data array is organized according to a translation table, which describes the locations of data for tests and criteria for data to be analyzed within the data array. Numerous other data arrangements such as a coordinate file listing a pre-defined maximum number of fail points, or a chip report including fail points by chip may also be generated. The data array reports all test data in a more easily generated and stored form, and may be converted to an image. A data analysis method for analyzing data using the data array is also disclosed.

A first aspect of the invention provides a method of reporting test data based on a plurality of tests of an array structure, the method comprising the steps of: obtaining the test data; and reporting the test data in a data array, the data array including at least two portions representing different tests.

A second aspect of the invention provides a system for reporting test data based on a plurality of tests of an array structure, the system comprising: means for obtaining the test data; and means for reporting the test data in a data array, the data array including at least two portions representing different tests.

A third aspect of the invention provides a program product stored on a computer-readable medium, which when executed, reports test data based on a plurality of tests of an array structure, the program product comprising: program code for obtaining the test data; and program code for reporting the test data in a data array, the data array including at least two portions representing different tests.

A fourth aspect of the invention provides a method of analyzing test data for an array structure, the method comprising the steps of: receiving a report of the test data in a data array, the data array including at least two portions representing different tests; scanning the data array to obtain the test data for the array structure according to a translation table; and analyzing the data.

A fifth aspect of the invention provides a computer-readable medium that includes computer program code to enable a computer infrastructure to reporting and/or analyzing test data based on a plurality of tests of an array structure, the computer-readable medium comprising computer program code for performing the method steps of the invention.

A sixth aspect of the invention provides a business method for reporting and/or analyzing test data based on a plurality of tests of an array structure, the business method comprising managing a computer infrastructure that performs each of the steps of the invention; and receiving payment based on the managing step.

A seventh aspect of the invention provides a method of providing a service for reporting test data based on a plurality of tests of an array structure, the method comprising: obtaining a computer infrastructure; and for each of the steps of the method of the invention, deploying a unit for performing the step to the computer infrastructure.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, the invention provides reporting and/or analyzing test data based on a plurality of tests of an array structure using a data array. For purposes of illustration, one type of array structure that will be used to describe the invention is a memory array. It should be recognized, however, that the teachings of the invention are applicable to a variety of array structures such as a fuse array, defect detector shapes array, etc.

Figure 2:
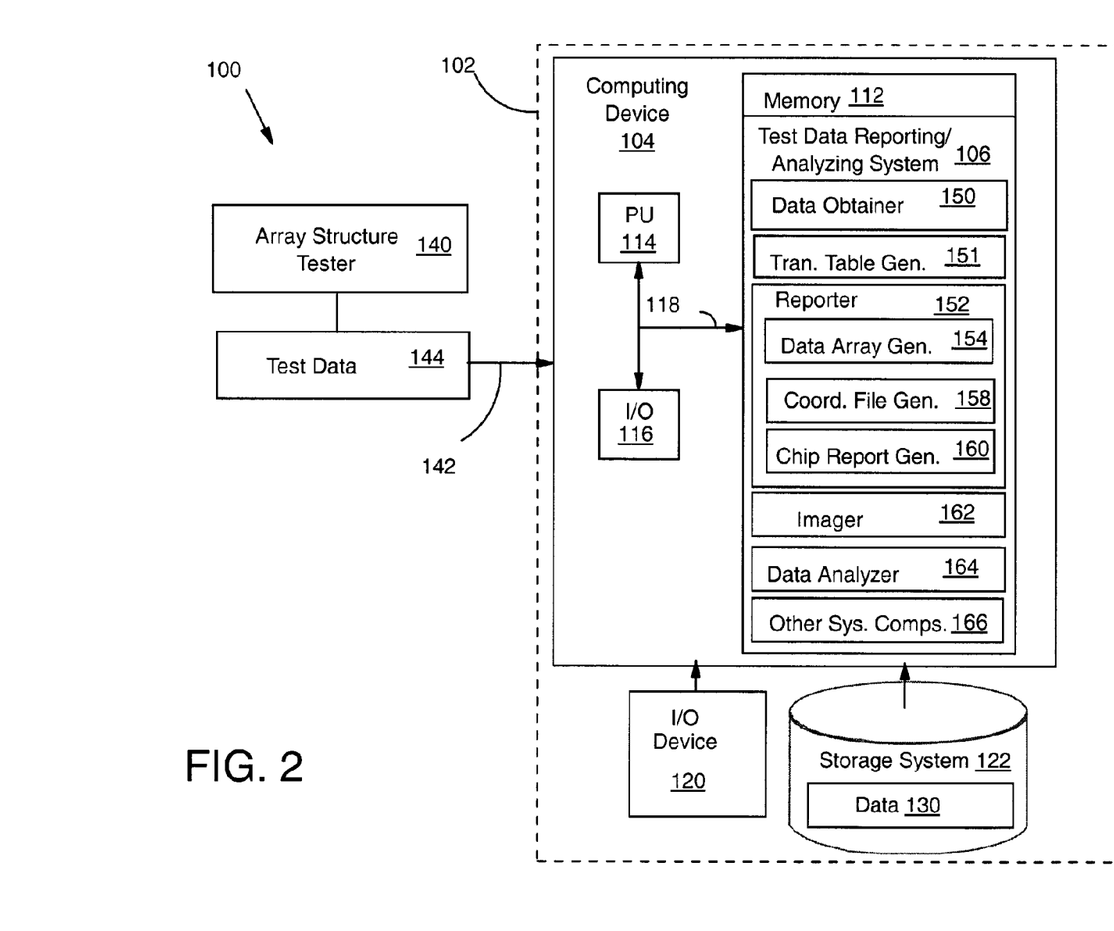
FIG. 2 shows a block diagram of a test data reporting and analyzing system according to one embodiment of the invention.

Turning to the drawings, FIG. 2 shows an illustrative environment 100 for reporting and/or analyzing test data 144 based on a plurality of tests of an array structure using a data array. To this extent, environment 100 includes a computer infrastructure 102 that can perform the various process steps described herein for reporting and/or analyzing test data based on a plurality of tests of an array structure using a data array. In particular, computer infrastructure 102 is shown including a computing device 104 that comprises a test data reporting/analyzing system 106 (hereinafter simply "system 106"), which enables computing device 104 to report and/or analyze test data based on a plurality of tests of an array structure using a data array by performing the process steps of the invention.

Computing device 104 is shown including a memory 112, a processor 114, an input/output (I/O) interface 116, and a bus 118. Further, computing device 104 is shown in communication with an external I/O device/resource 120 and a storage system 122. As is known in the art, in general, processor 114 executes computer program code, such as system 106, that is stored in memory 112 and/or storage system 122. While executing computer program code, processor 114 can read and/or write data 130, such as test data, data array, etc., to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices.

In any event, computing device 104 can comprise any general purpose computing article of manufacture capable of executing computer program code installed by a user (e.g., a personal computer, server, handheld device, etc.). However, it is understood that computing device 104 and system 106 are only representative of various possible equivalent computing devices that may perform the various process steps of the invention. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the invention. For example, in one embodiment, computer infrastructure 102 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computing devices may utilize any combination of various types of transmission techniques.

Although not necessary, infrastructure 102 may also include an array structure tester 140. Array structure tester 140 is shown in communication with computing device 104 over a communications link 142. As discussed above, communications link 142 can comprise any combination of various types of communications links as is known in the art. Tester 140 may comprise any now known or later developed testing equipment, i.e., hardware and/or software, appropriate for the type of array structure to be tested, e.g., a memory tester for a memory array. It is understood that array structure tester 140 can comprise the same components (processor, memory, I/O interface, etc.) as shown for computing device 104. These components have not been separately shown and discussed for brevity.

System 106 is shown including the following components: a test data obtainer 150; a translation table generator 151; a reporter 152 including a data array generator 154, a coordinate file generator 158 and a chip report generator 160; an imager 162 and a data analyzer 164. Other system components 166 may include any other peripheral functions required for operation, but not expressly described herein. Operation of each of these components is discussed further below. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 3:
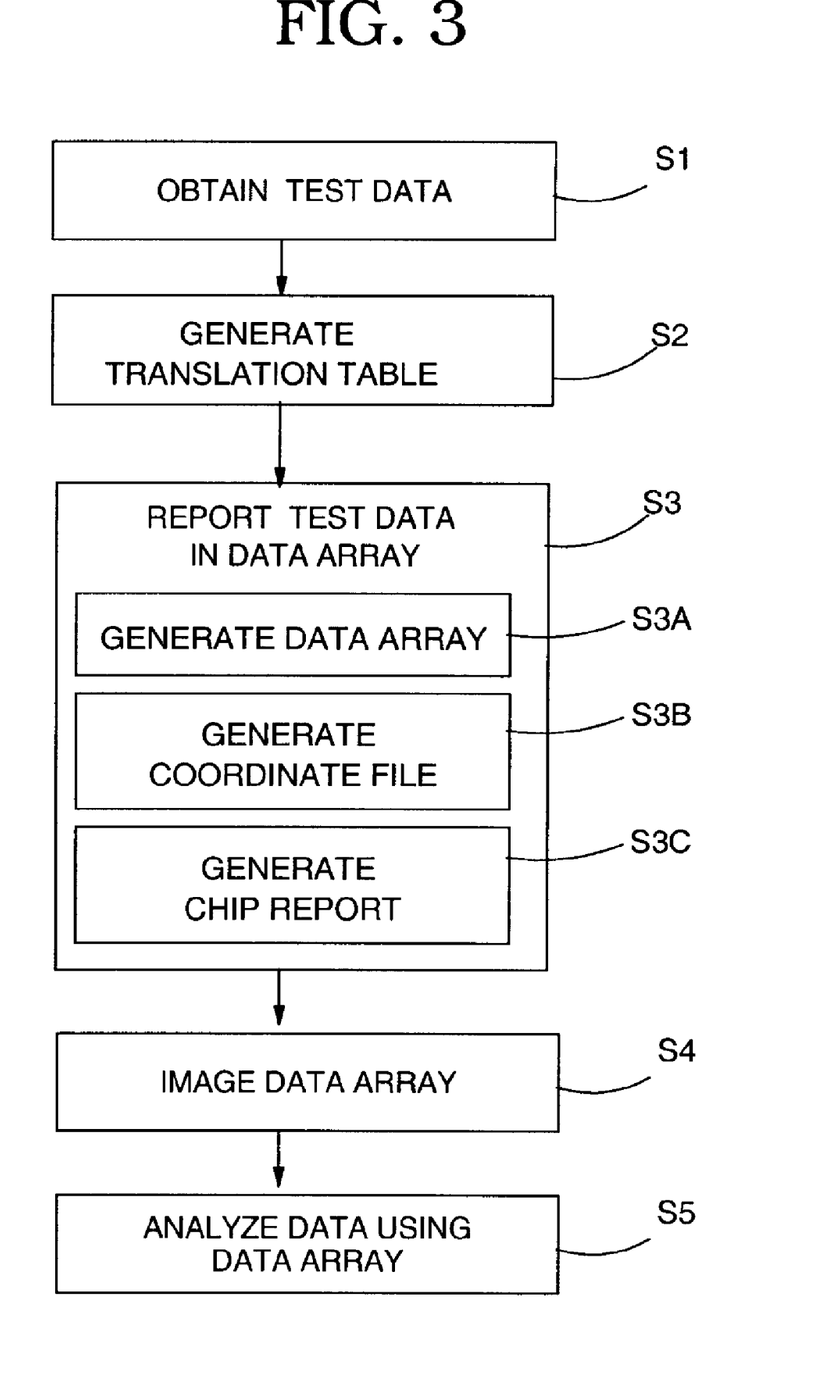
FIG. 3 shows a flow diagram showing one embodiment of an operational methodology of the system of FIG. 2.
Figure 4:
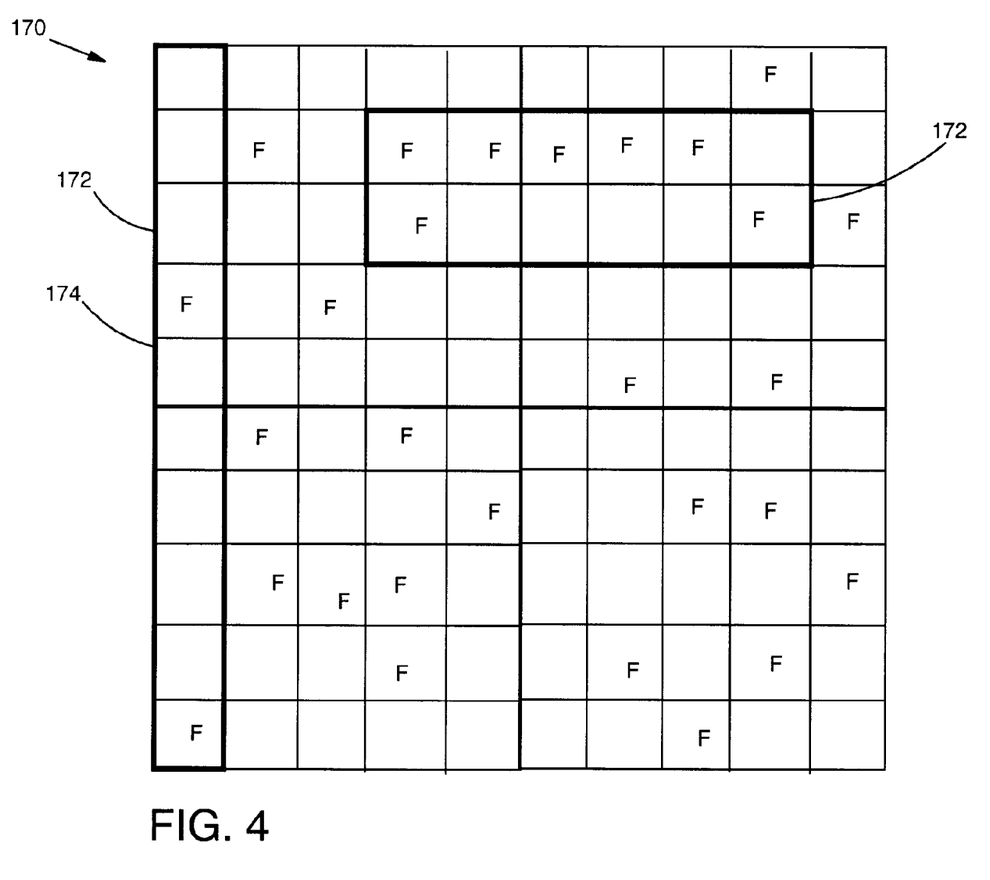
FIG. 4 shows an illustrative data array according to one embodiment of the invention.

Turning to FIG. 3, in conjunction with FIGS. 2 and 4-7, one embodiment of operational methodology of system 106 will now be described. Instead of dumping data for each test into a bit fail map without details or generating a huge ASCII file with all of the data, one embodiment of the present invention takes test data 144 (FIG. 2) and reports it in a data array 170 (FIG. 4). A translation table 180 (FIG. 5) is generated to explain the data array's organization.

In a first step S1, data obtainer 150 causes test data 144 to be obtained. This step may include any now known or later developed manner of receiving test data 144 from tester 140. For example, over a communications link 142, wireless transmission, etc. Test data 144 may be provided in any of a variety of forms such as a bit fail map, data stream, etc.

Next in step S2, translation table generator 151 causes a translation table 180 to be generated. A translation table indicates the location of test data for a particular test in data array 170 (FIG. 4), i.e., it explains the organization of data array 170 (FIG. 4), and criteria for data to be analyzed within the data array. It should be recognized that use of data array 170 does not necessarily require translation table 180 if a user, although improbable, can keep track of data's location within data array 170. Translation table 180 may include the following information: test names providing an identifier for the various tests' data within data array 170 (FIG. 4), e.g., Map_FScan, Map_SSCAN1, etc., and data position for the tests within data array 170, i.e., the position of portions 172 that correspond to a test within data array 170. With regard to data position, translation table 180 may include: starting column of test data within data array, ending column of test data within data array, starting row of test data within data array, and ending row of test data within data array. For example, test Map_FScan has a portion 174 (FIG. 4) including its data in rows 0 to 224 (not all shown) and columns 0 to 0. Hence, data for Map-FScan may be provided in portion 182, a first row of translation table 180 in FIG. 5, assuming translation table 180 was extended to full size. Placement in a row in data array 170 is not always the case, however. For example, test SM4_WLNS1 has a portion (not shown in data array) including its data in rows 448 to 895 and columns 515 to 626.

Translation table 180 may also include other information for each test such as: a set identifier indicating a group to which the test belongs, e.g., set 1, 2 or 3; the number of tests in a set to which the test belongs; relative test position within the set, e.g., 2 of 4, 4 of 8, etc. Furthermore, translation table 180 may also include a predefined number of fail points for a particular test to be reported in a coordinate file (FIG. 6) (coordinate file max), as will be described below.

Next, in step S3, reporter 152 causes test data 144 (FIG. 2) to be reported in a data array 170, as shown in FIG. 4. In particular, in sub-step S3A, data array 170 is generated using data array generator 154. Referring to FIG. 4, data array 170 includes at least two portions 172 representing different tests. That is, different portions 172 represent results of different tests completed by tester 140 (FIG. 2). Although they look similar, data array 170 is not the same as a bit fail map. Data array 170 indicates fail points of memory cells like a bit fail map, but there is no relationship between the location of a fail point in the data array to a location in the array structure. Data array 170 may also have a size that is a multiple of the number of cells in an array structure since it may include cells for numerous tests of the array structure. Note, the illustrative data array 170 is simplified for purposes of description; typically, it is a very large array, e.g., 1024×2048.

Figure 5:
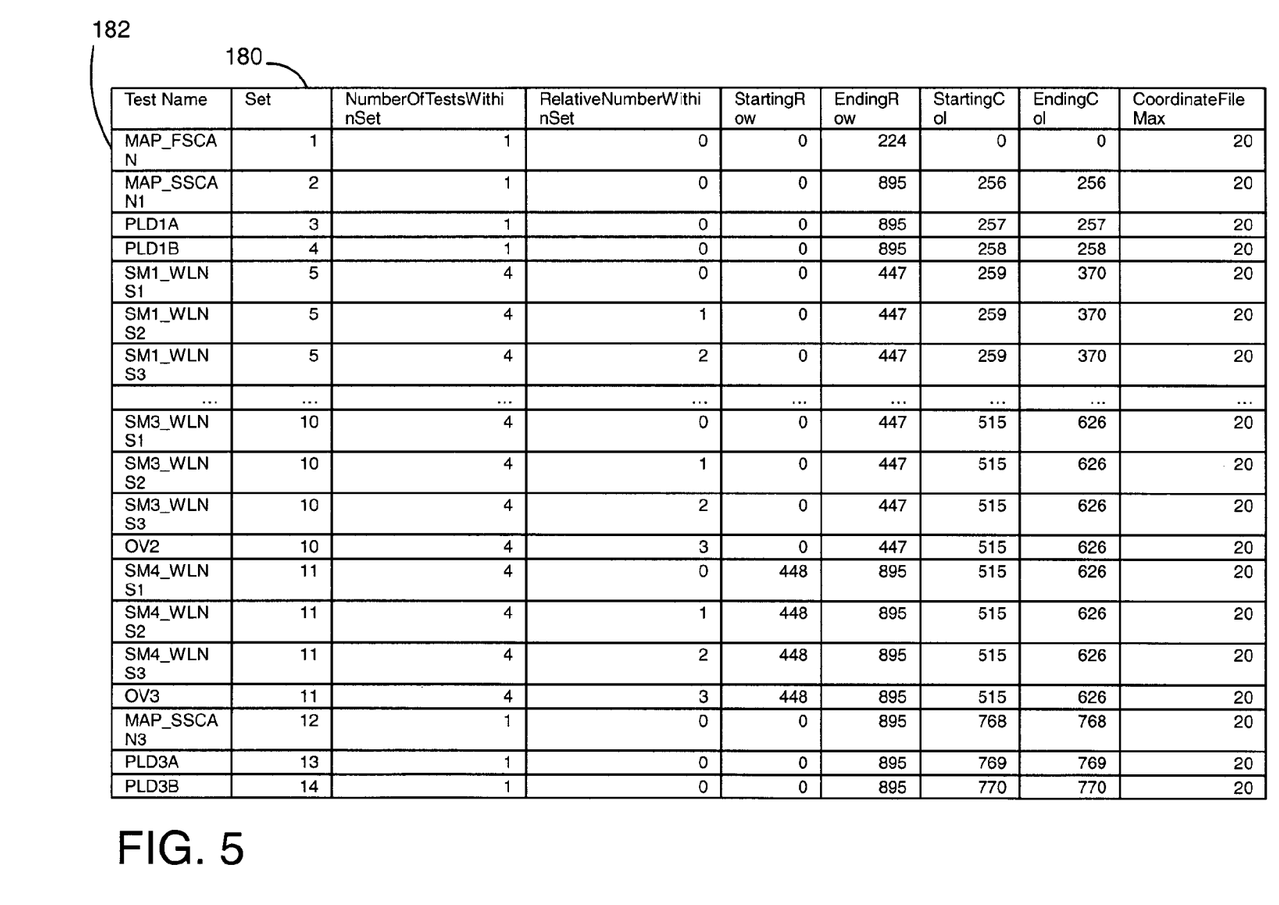
FIG. 5 shows an illustrative translation table for use with the data array of FIG. 4.

Data stored in data array 170 is preferably organized according to a translation table 180, one illustrative embodiment of which is shown in FIG. 5. Again, it should be recognized that use of data array 170 does not necessarily require translation table 180 if a user, although improbable, can keep track of data's location within data array 170.

Figure 6:
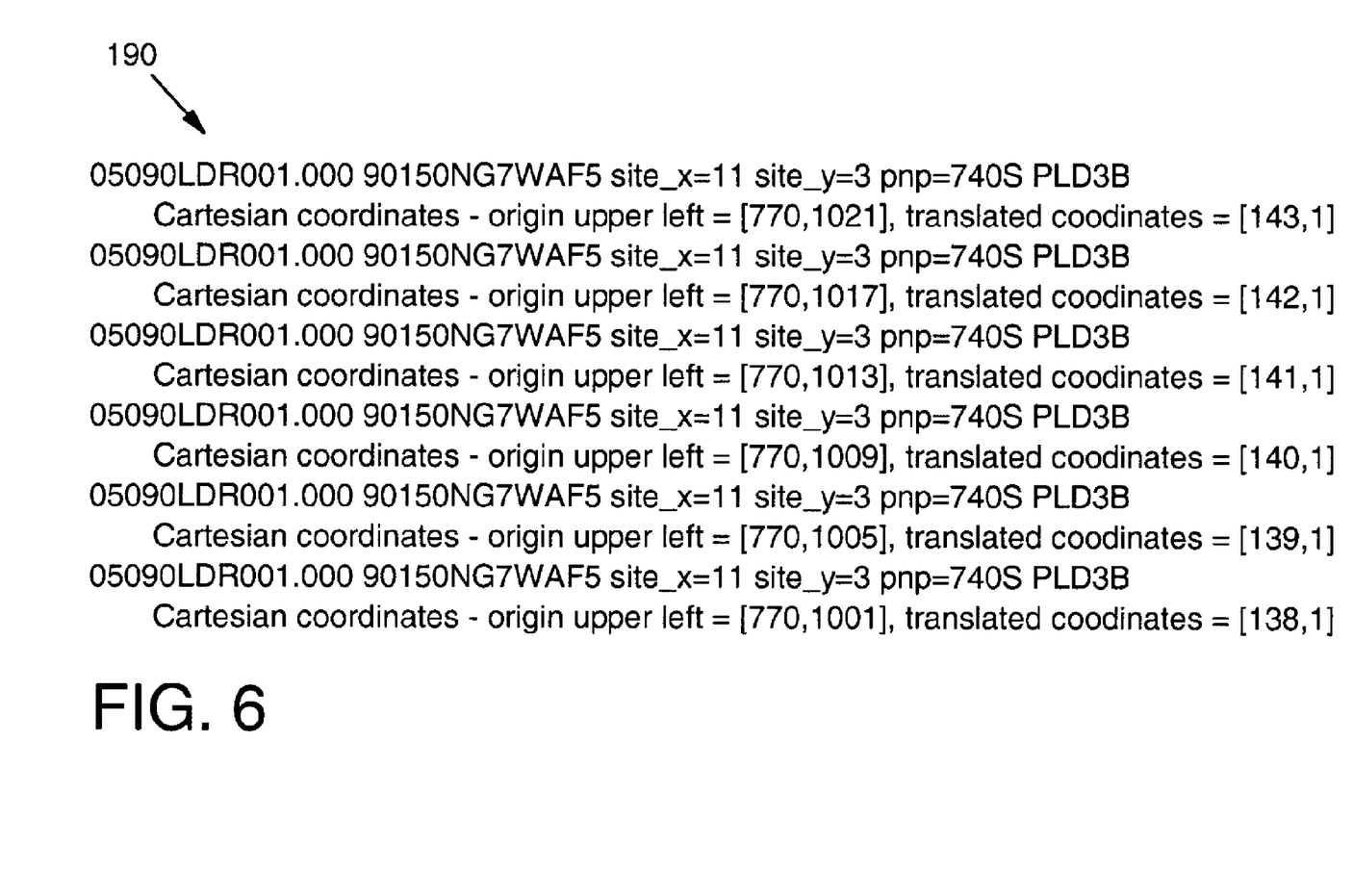
FIG. 6 shows an illustrative coordinate file for use with the data array of FIG. 4.

In optional sub-step S3B, coordinate file generator 158 causes a coordinate file 190 to be generated, as shown in FIG. 6, including the predefined number of fail points for a particular test, e.g., 20. The predefined number is provided in translation table 180 and can be user-defined. As shown in FIG. 6, coordinate file 190 includes six fail points. Each fail point may include, for example, wafer lot ID, and wafer ID, chip site X, Y (test site) which indicates the location of the chip tested on the wafer, test name (e.g., PLD3B), and then coordinates within data array 170 that includes location of fail points with corresponding array structure cell location. That is, coordinate table 190 includes a data array coordinate and an array structure coordinate for the defined maximum number of fail points. Coordinate file 190 is useful to determine the type and exact location of fail points.

Figure 7:
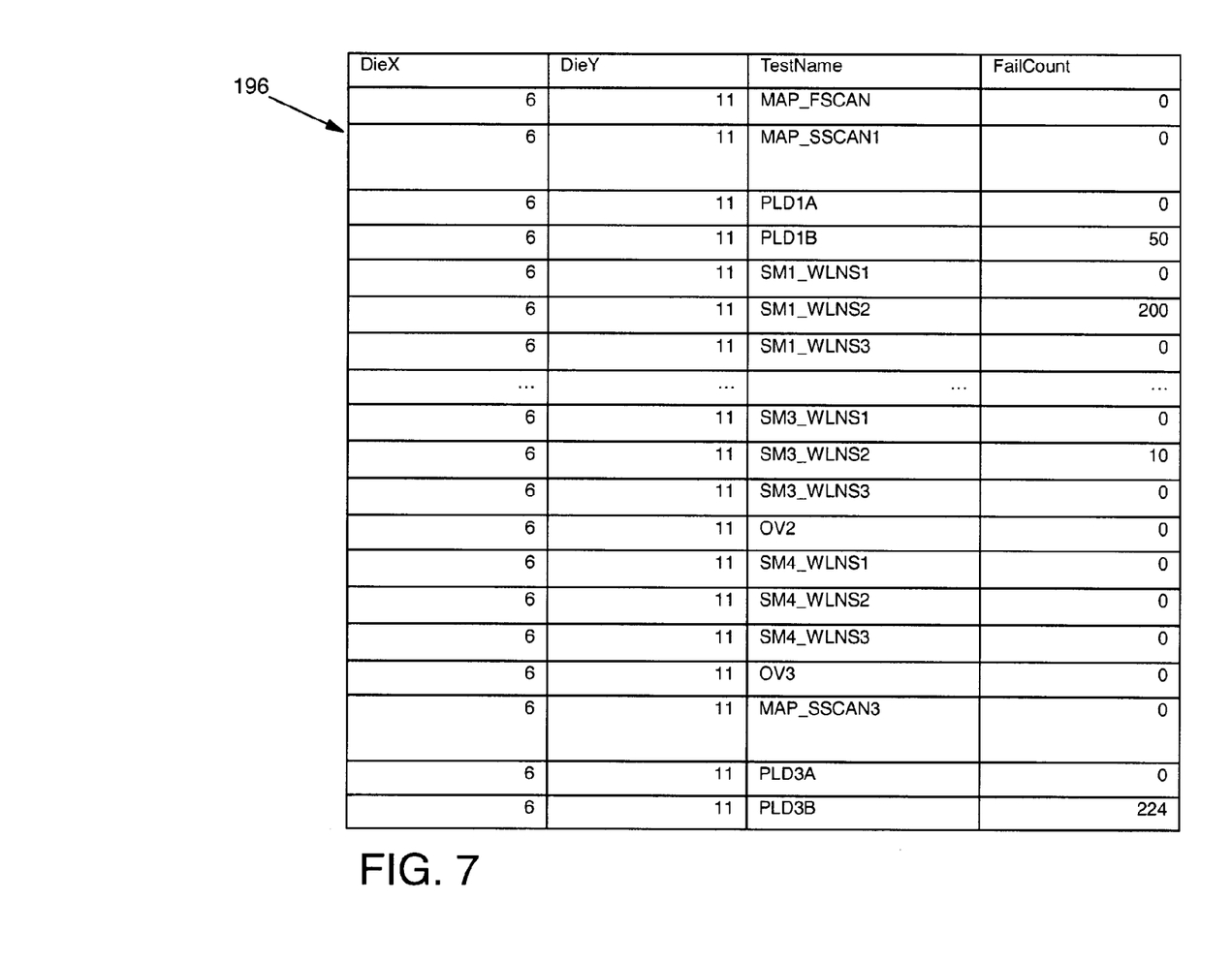
FIG. 7 shows an illustrative chip report for use with the data array of FIG. 4.

In another optional sub-step S3C, chip report generator 160 may generate a chip report including results of each test on a chip. An illustrative chip report 196 is shown in FIG. 7. In one embodiment, a chip report 196 may include chip (die) X and Y location on a wafer, test name and number of fails (failcount) for each test. As one with skill in the art will recognize, chip report 190 may also include a variety of other information for each chip.

During step S3, testing can continue for other wafers within a lot, thus removing the need to pause for data rendering.

Continuing with FIG. 4, once testing has been completed, an optional next step S4 may include imager 162 (FIG. 2) data array 170 to be rendered as an image. In one embodiment, the image is a compressed file, e.g., a Tagged Image File Format (TIFF) image, containing a bitmap of data array 170 for each chip, i.e., test site. Imager 162 may extract the data from data array 170 into a stream of binary data (each bit in data array 170 may be 1 pixel in the TIFF file, which can be converted to binary), i.e., a raster of bit data.

Figure 8:
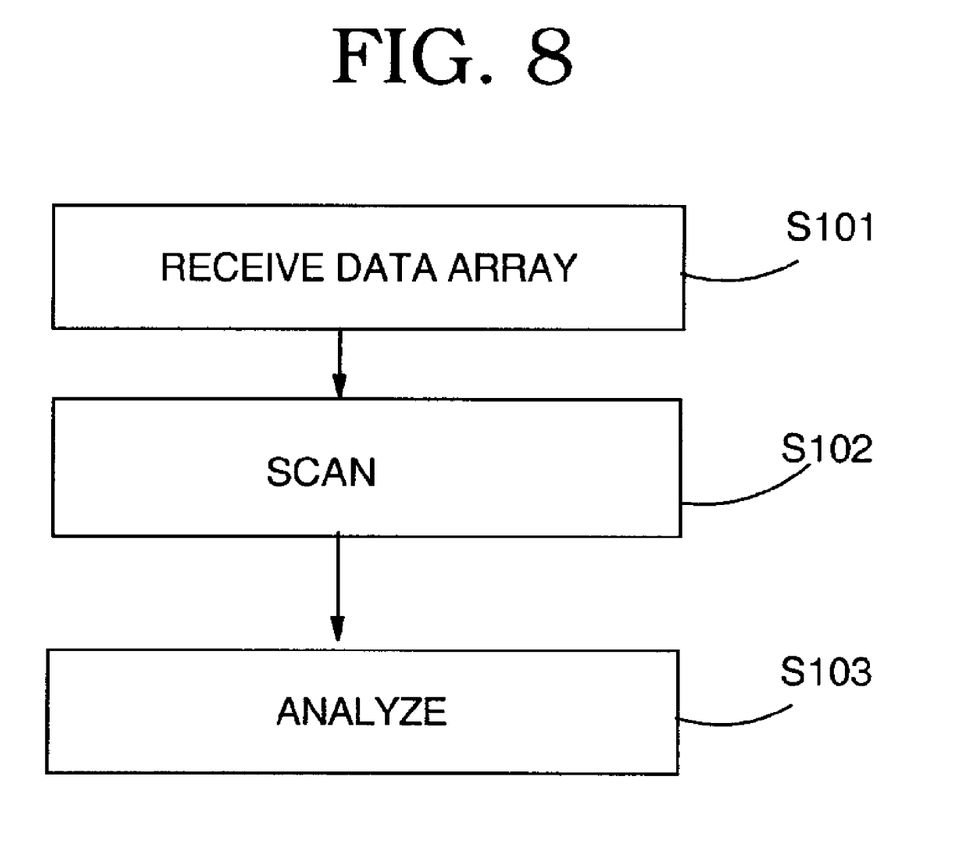
FIG. 8 shows a flow diagram showing one embodiment of an analyzing methodology of the system of FIG. 2.

In step S5, data analyzer 166 causes analysis of data using data array 170, e.g., in the form of the TIFF file. Turning to FIG. 8, a flow diagram of an analyzing method will now be described. In one embodiment, in a first step S101, data analyzer 166 receives a report of the test data in a data array 170, the data array including at least two portions representing different tests. Next, in step S102, data analyzer 166 scans data array 170 to obtain the test data for the array structure according to translation table 180. As noted above, data array 170 may be an image, e.g., in TIFF. In this regard, data analyzer 166 may include any now known or later developed image scanner and related hardware/software for recognizing the test data, e.g., optical character recognition, etc. Translation table 180 is used to translate the scanned data array. In step S103, data analyzer 166 causes the test data to be analyzed. The analysis may include any now known or later developed test data analysis such as failure analysis. The analysis results for a test may be added to a conventional analysis summary. Each data array 170 for a wafer may be analyzed and the analyses summarized. Since data analyzer 166 is executed as a post process to data array generation, it may function as a parallel process as additional array structures are tested and data arrays are generated (step S3A). Use of data array 170 and data analyzer 166 significantly reduces the test time and resources needed to obtain test results.

It is understood that the order of the above-described steps is only illustrative. To this extent, one or more steps can be performed in parallel, in a different order, at a remote time, etc. Further, one or more of the steps may not be performed in various embodiments of the invention. In addition, structure of system 106 and tester 140 may be different than as shown. For example, system 106 may be implemented as part of a larger tester system.

While shown and described herein as a method and system for reporting and/or analyzing test data based on a plurality of tests of an array structure using a data array, it is understood that the invention further provides various alternative embodiments. For example, in one embodiment, the invention provides a computer-readable medium that includes computer program code to enable a computer infrastructure to report and/or analyze test data based on a plurality of tests of an array structure using a data array. To this extent, the computer-readable medium includes program code, such as system 106 (FIG. 2), which implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 (FIG. 2) and/or storage system 122 (FIG. 2) (e.g., a fixed disk, a read-only memory, a random access memory, a cache memory, etc.).

In another embodiment, the invention provides a business method that performs the process steps of the invention on a subscription, advertising, and/or fee basis. That is, a service provider, such as an Internet Service Provider, could offer to report and/or analyze test data based on a plurality of tests of an array structure using a data array as described above. In this case, the service provider can manage (e.g., create, maintain, support, etc.) a computer infrastructure, such as computer infrastructure 102 (FIG. 2), that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of providing a service for reporting and/or analyzing test data based on a plurality of tests of an array structure using a data array. In this case, a computer infrastructure, such as computer infrastructure 102 (FIG. 2), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computing device 104 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of reporting test data based on a plurality of tests of an array structure, the method comprising:
    obtaining the test data;
    generating a translation table indicating a location of test data for a particular test in a data array; and
    reporting the test data in a data array, the data array including at least two portions representing different tests,
    wherein the translation table further includes a predefined number of fail points for a particular test to be reported in a coordinate file,
    wherein the reporting further includes generating the coordinate file including the predefined number of fail points for a particular test, the coordinate file further including a data array coordinate and an array structure coordinate for each of the predefined number of fail points, wherein the data array coordinate represents a location of a fail point within the data array, wherein the array structure coordinate represents a location of a fail point within the array structure, and wherein the data array coordinate in the coordinate file does not correspond to the array structure coordinate in the array structure.

2. The method of claim 1, wherein the reporting further includes generating a chip report including results of each test on a chip.

3. The method of claim 1, farther comprising rendering the data array as an image.

4. A system for reporting test data based on a plurality of tests of an array structure, the system comprising:
    at least one computer including:
    an obtainer used to obtain the test data;
    a generator used to generate a translation table, the translation table indicating a location of test data for a particular test in a data array and
    a reporter used to report the test data in the data array, the data array including at least two portions representing different tests,
    wherein the translation table further includes a predefined number of fail points for a particular test to be reported in a coordinate file,
    and the reporter further generates the coordinate file including the predefined number of fail points for a particular test, the coordinate file further including a data array coordinate and an array structure coordinate for each of the predefined number of fail points, wherein the data array coordinate represents a location of a fail point within the data array, wherein the array structure coordinate represents a location of a fail point within the array structure, and wherein the data array coordinate in the coordinate file does not correspond to the array structure coordinate in the array structure,
    wherein the reporter further generates a chip report including results of each test on a chip.

5. The system of claim 4, further comprising an analyzer used to analyze the data array using the translation table.

6. The system of claim 4, further comprising an imager used to render the data array as an image.

7. A program product stored on a computer-readable medium, which when executed, reports test data based on a plurality of tests of an array structure, the program product comprising:
    program code for obtaining the test data;
    program code for generating a translation table indicating the location of test data for a particular test in the data array; and
    program code for reporting the test data in a data array, the data array including at least two portions representing different tests,
    wherein the translation table further includes a predefined number of fail points for a particular test to be reported in a coordinate file,
    and the reporting code further generates the coordinate file including the predefined number of fail points for a particular test, the coordinate file further including a data array coordinate and an array structure coordinate for each of the predefined number of fail points, wherein the data array coordinate represents a location of a fail point within the data array, wherein the array structure coordinate represents a location of a fail point within the array structure, and wherein the data array coordinate in the coordinate file does not correspond to the array structure coordinate in the array structure, wherein the reporting code further generates a chip report including results of each test on a chip.

8. The program product of claim 7, further comprising program code for analyzing the data array using the translation table.

9. The program product of claim 7, further comprising program code for rendering the data array as an image.

* * * * *